(12) United States Patent
Lebo et al.

(10) Patent No.: US 9,872,402 B2
(45) Date of Patent: *Jan. 16, 2018

(54) SECURITY MECHANISM FOR ELECTRICAL COMPONENTS

(71) Applicant: Enginuity Communications Corporation, St. Charles, IL (US)

(72) Inventors: Stephen K. Lebo, Falls Church, VA (US); David O. Corp, Clifton, VA (US)

(73) Assignee: Enginuity Communications Corporation, St. Charles, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/688,251

(22) Filed: Apr. 16, 2015

(65) Prior Publication Data

US 2015/0223356 A1 Aug. 6, 2015

Related U.S. Application Data

(63) Continuation of application No. 13/767,178, filed on Feb. 14, 2013, now Pat. No. 9,025,343.

(60) Provisional application No. 61/725,862, filed on Nov. 13, 2012.

(51) Int. Cl.
*H02B 1/48* (2006.01)
*H05K 5/02* (2006.01)

(52) U.S. Cl.
CPC .......... *H05K 5/0208* (2013.01); *H05K 5/026* (2013.01); *H05K 5/0226* (2013.01); *H05K 5/0239* (2013.01); *H02B 1/48* (2013.01); *Y10T 29/49117* (2015.01); *Y10T 29/49169* (2015.01)

(58) Field of Classification Search
CPC ........ H05K 5/02; H05K 13/04; H05K 5/0208; H05K 5/026; H05K 5/0226; H05K 5/0239; H02B 1/48; H04Q 1/028; H02G 3/08

USPC ..... 361/601, 679.01, 814, 823, 824; 385/53, 385/88, 92, 101, 103, 113, 134, 135, 138; 439/71, 74, 78.1, 64, 138, 377, 49; 312/223.1, 223.2, 326, 262, 295; 174/50.51, 58, 60, 520, 50
See application file for complete search history.

(56) References Cited

U.S. PATENT DOCUMENTS

| | | | |
|---|---|---|---|
| 3,866,000 A | | 2/1975 | Gillis |
| 4,800,588 A | * | 1/1989 | Poster, Jr. ............. H04Q 1/028 379/412 |
| 5,359,654 A | * | 10/1994 | Jensen ................ H01R 4/2433 379/397 |
| 5,879,173 A | | 3/1999 | Poplawski et al. |
| 5,901,220 A | * | 5/1999 | Garver ................ H04M 1/0293 379/399.01 |
| 6,508,670 B1 | | 1/2003 | Hwang |
| 6,621,974 B1 | | 9/2003 | Chu |
| 6,868,219 B2 | | 3/2005 | Miller et al. |
| 6,896,137 B2 | | 5/2005 | McHutchinson |
| 6,909,834 B2 | | 6/2005 | Tomino et al. |
| 6,970,351 B2 | | 11/2005 | Perez |
| 6,990,192 B1 | * | 1/2006 | Denovich .............. H04N 7/104 379/326 |
| 7,287,917 B2 | | 10/2007 | Adams et al. |
| 7,350,984 B1 | | 4/2008 | Togami |

(Continued)

*Primary Examiner* — Courtney Smith
(74) *Attorney, Agent, or Firm* — Dickinson Wright PLLC

(57) ABSTRACT

A telecommunication distribution box includes a housing and an electrical component mounted in the housing. A cover plate is movably connected to the housing and is movable between open and closed positions. A lip extends outwardly from the cover plate. The lip covers the electrical component when the cover plate is in the closed position to prevent accessing and removing the electrical component.

19 Claims, 15 Drawing Sheets

(56) References Cited

U.S. PATENT DOCUMENTS

| | | |
|---|---|---|
| 7,597,567 B2 | 10/2009 | Tanaka |
| 7,782,611 B2 | 8/2010 | Yeh |
| 8,077,470 B2 | 12/2011 | Zhang |
| 8,500,465 B1 * | 8/2013 | Ross .................... H01R 13/502 439/79 |
| 8,711,567 B2 * | 4/2014 | Warren ................ G06F 1/1624 361/679.27 |
| 9,270,098 B2 * | 2/2016 | Isaacks ................. H02G 3/086 |
| 2002/0146207 A1 | 10/2002 | Chu |
| 2002/0181896 A1 | 12/2002 | McClellan et al. |
| 2004/0117515 A1 * | 6/2004 | Sago .................... G02B 6/3895 710/1 |
| 2005/0215119 A1 * | 9/2005 | Kaneko ............. G06K 7/10178 439/607.01 |
| 2006/0148279 A1 * | 7/2006 | German ............... H01R 13/465 439/49 |
| 2007/0160193 A1 * | 7/2007 | Vo ...................... H01R 13/5213 379/413.02 |
| 2009/0142054 A1 | 6/2009 | Lipski et al. |
| 2009/0154072 A1 * | 6/2009 | Stachowiak, Jr. ..... G01R 11/04 361/659 |
| 2010/0108346 A1 * | 5/2010 | Curtis ................... H02G 3/086 174/51 |
| 2011/0217009 A1 | 9/2011 | Burrell |
| 2011/0241881 A1 * | 10/2011 | Badinelli ............. G02B 6/4446 340/541 |
| 2013/0328666 A1 * | 12/2013 | Renfro, Jr. ........... G02B 6/3878 340/10.1 |
| 2014/0290975 A1 * | 10/2014 | Isaacks ................. H02G 3/086 174/50.52 |

\* cited by examiner

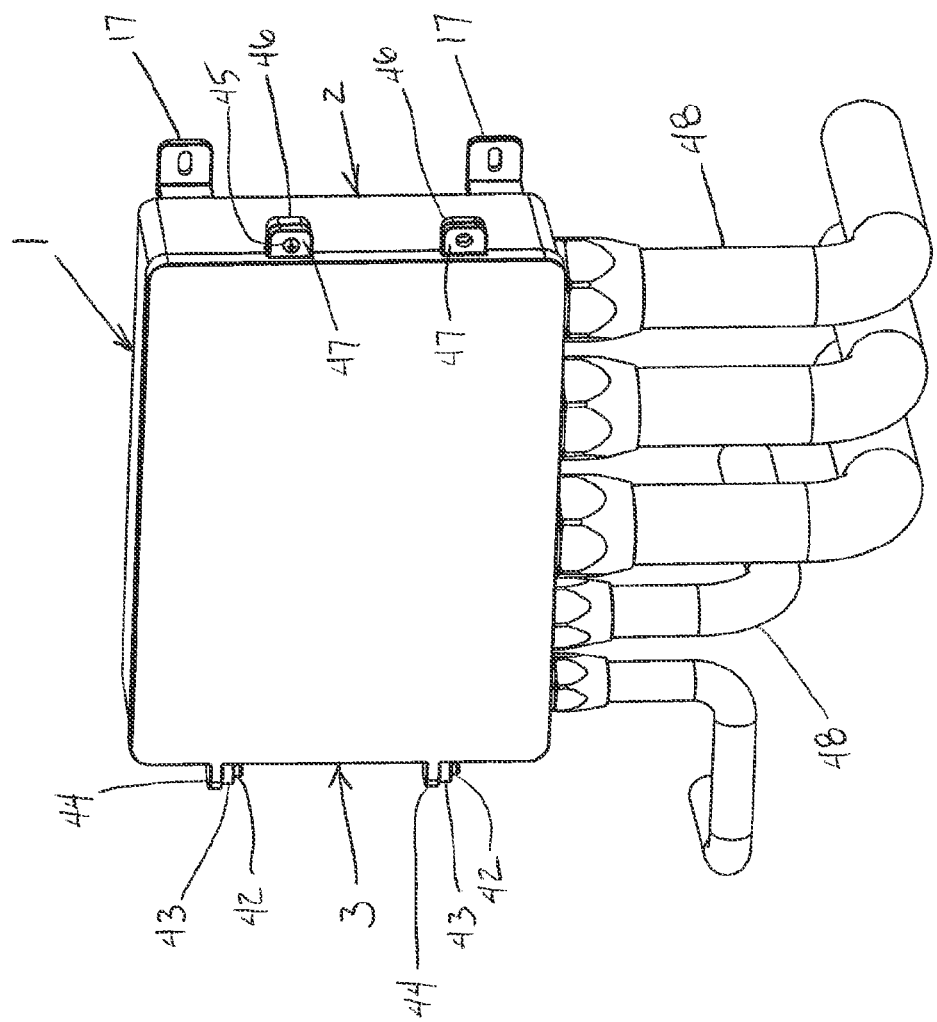

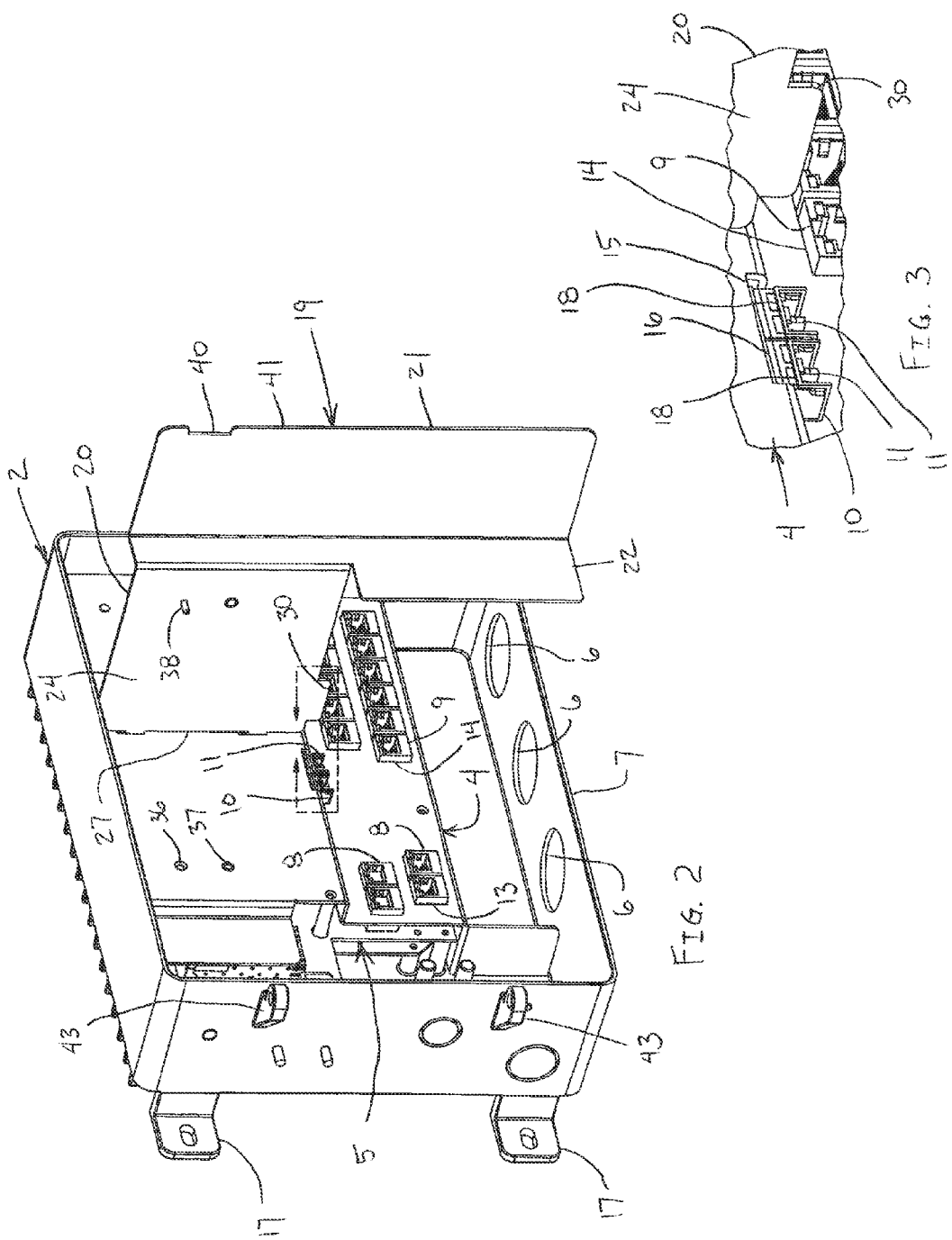

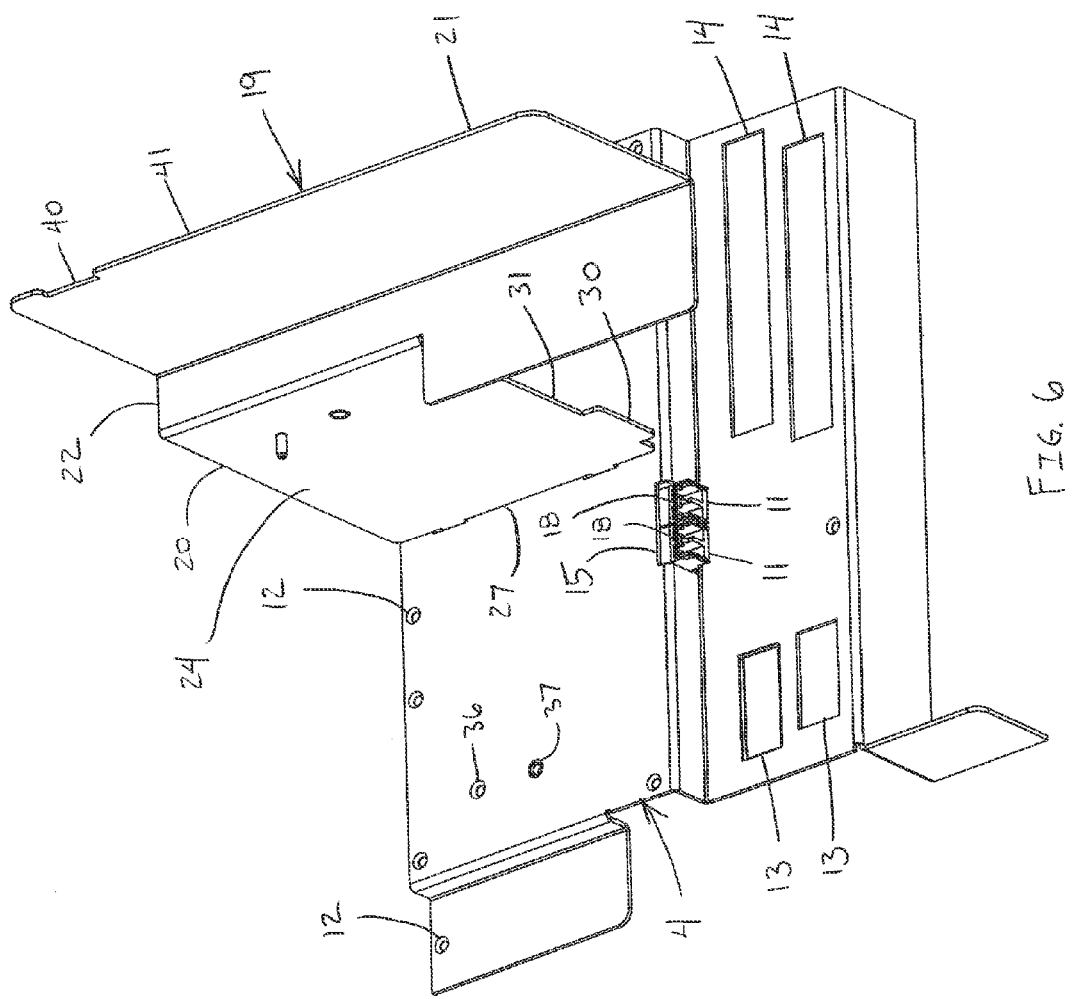

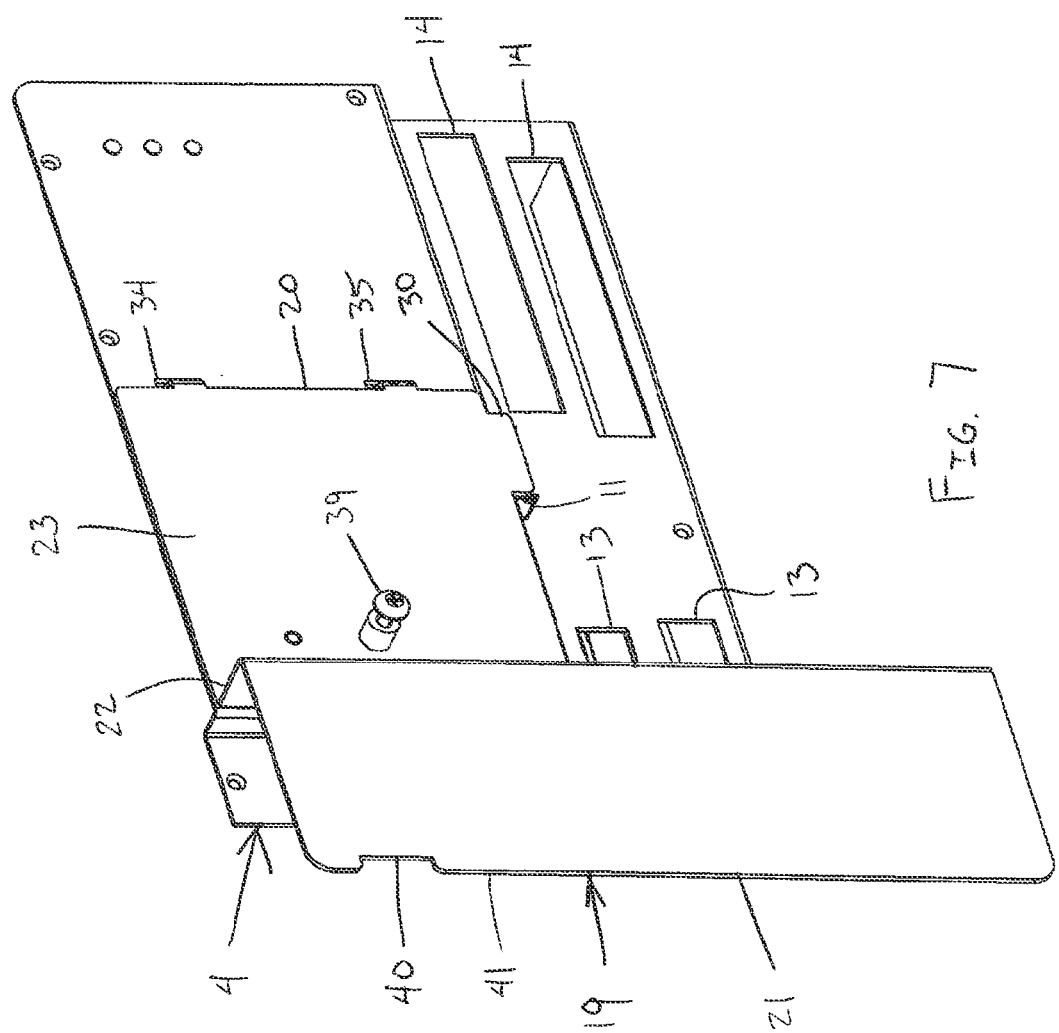

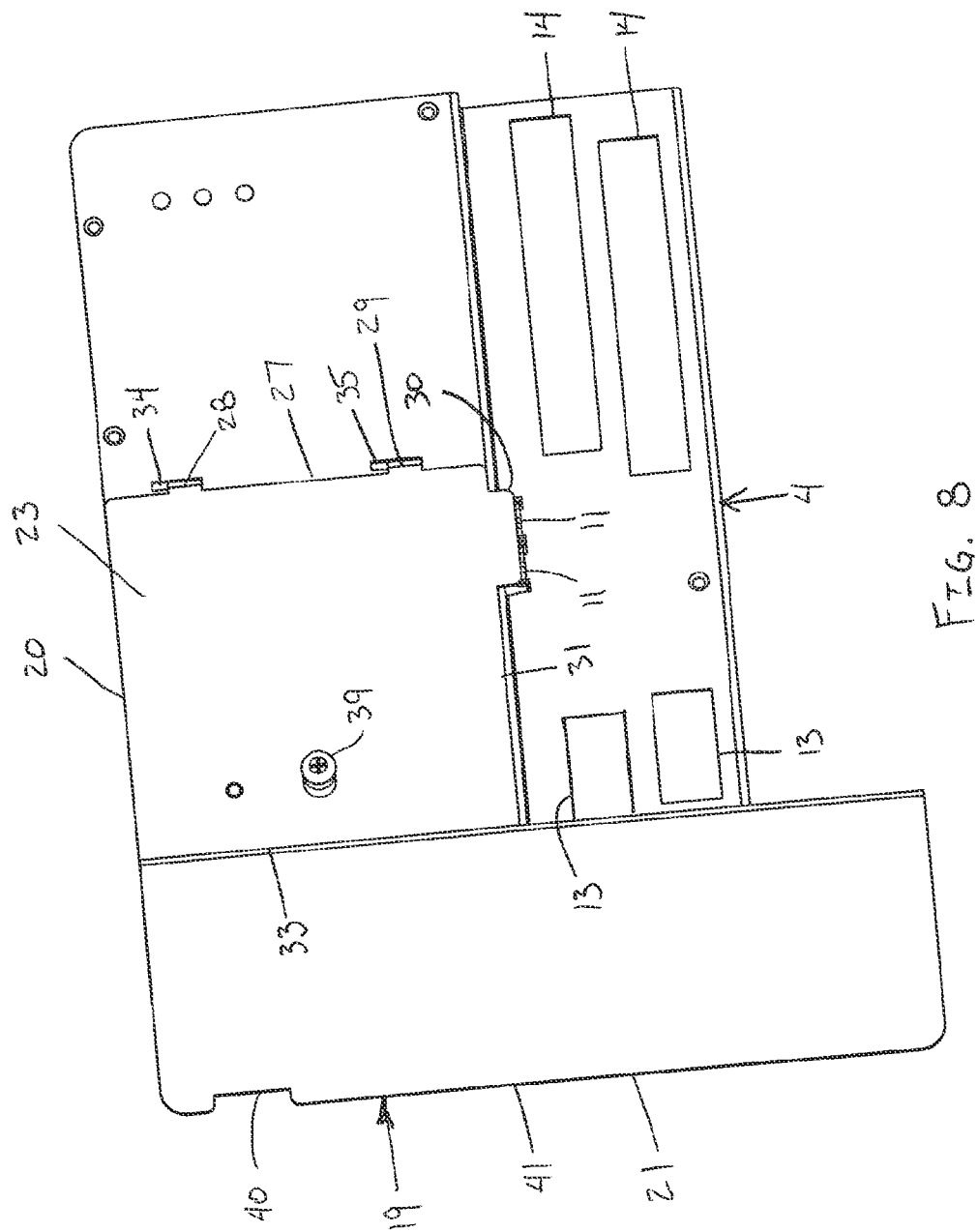

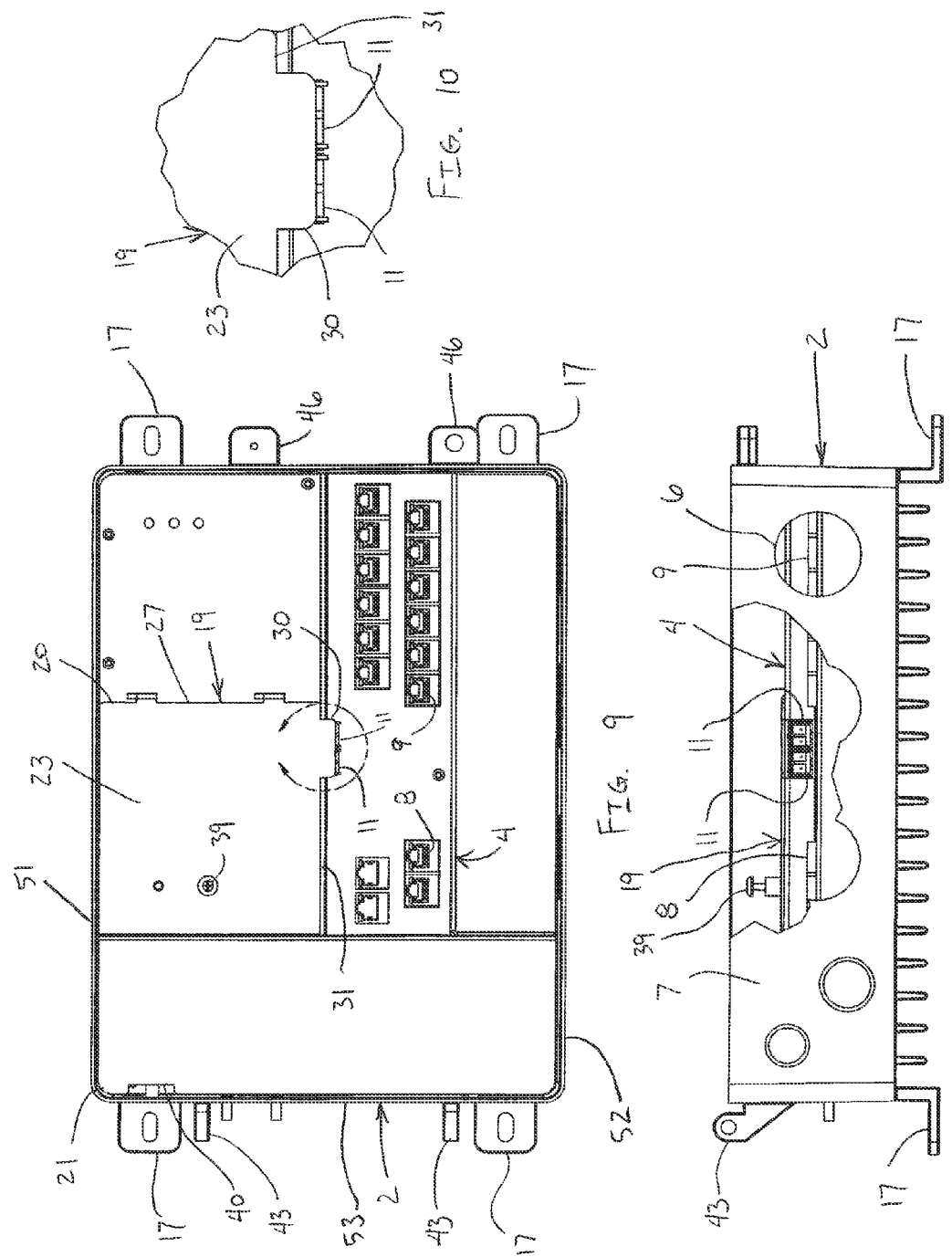

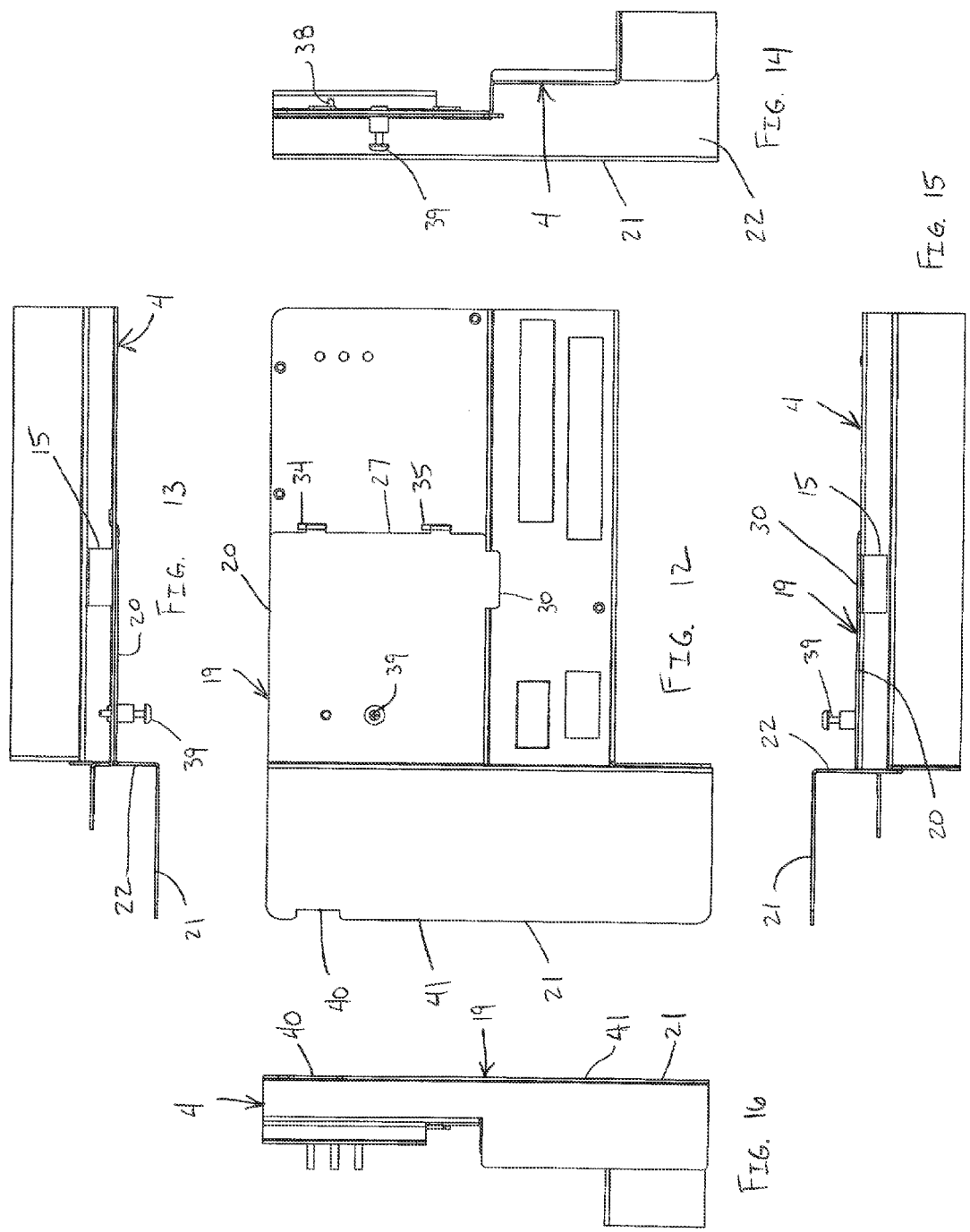

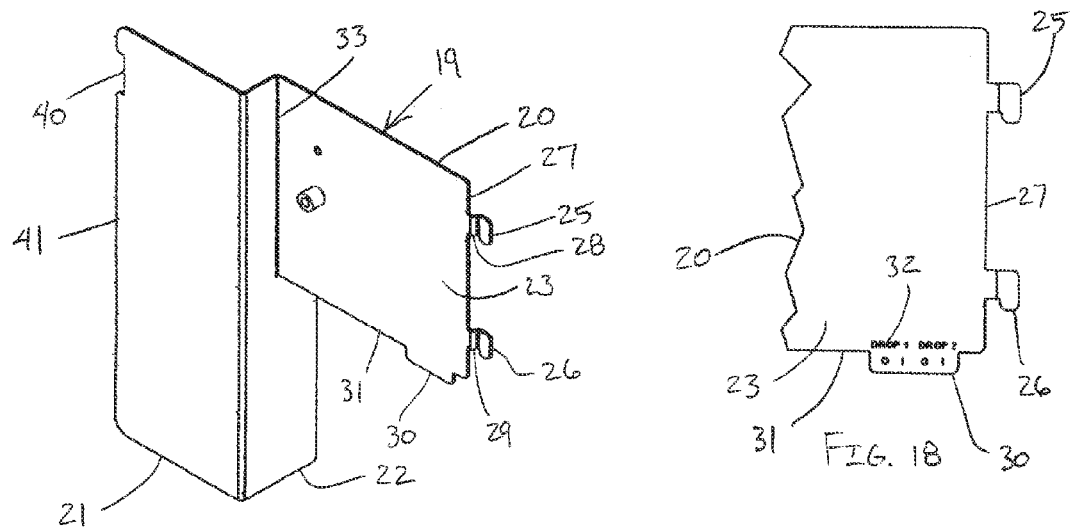
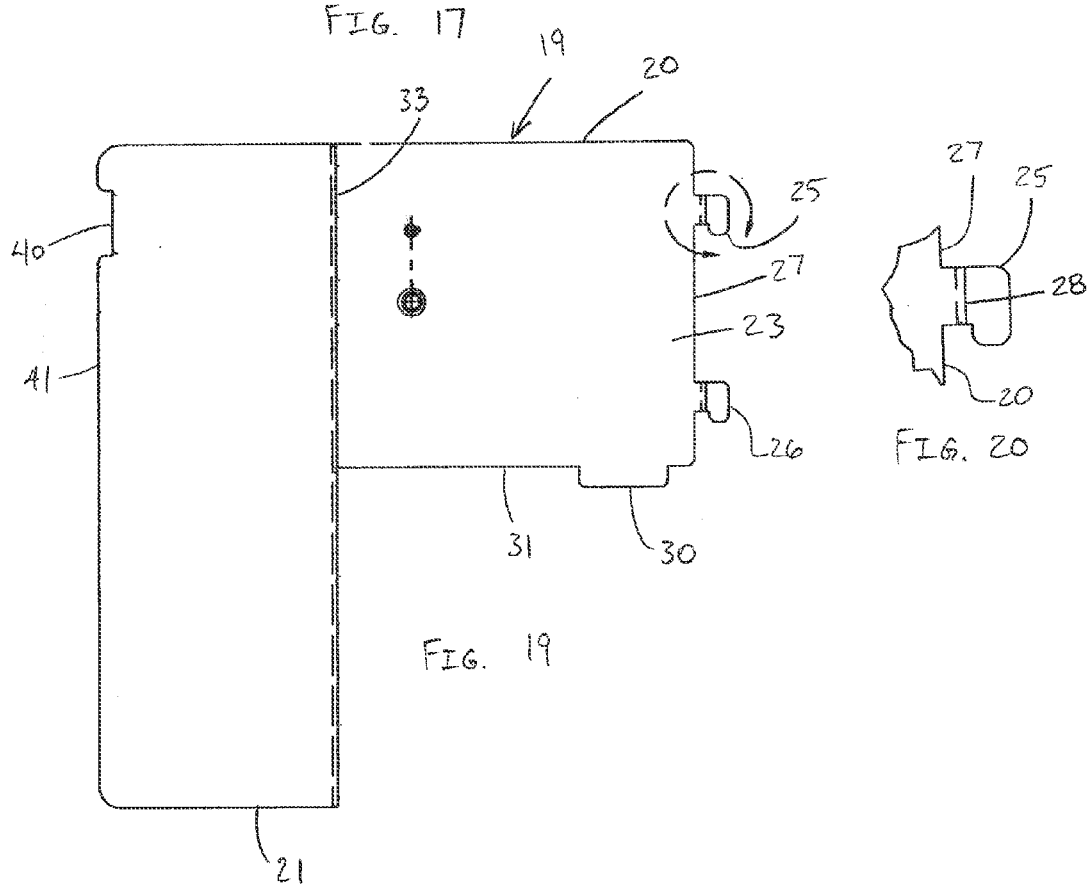

SECURITY MECHANISM FOR ELECTRICAL COMPONENTS

CROSS REFERENCE TO RELATED APPLICATION

This application claims the benefit under 35 U.S.C. § 119(e) of U.S. Provisional Application Ser. No. 61/725,862, filed Nov. 13, 2012, which is hereby incorporated by reference in its entirety.

FIELD OF THE INVENTION

The present invention relates generally to a security mechanism for electrical components. More particularly, the present invention relates to a cover plate covering a latch release lever of an installed electrical connector to substantially prevent accessing and removing the installed electrical connector. Still more particularly, the present invention relates to a lockable cover plate covering an installed electrical connector to prevent access thereto and being unlockable to allow access to the electrical connector.

BACKGROUND OF THE INVENTION

Large public communication carriers (hereinafter, "telcos") typically mount telecommunication distribution boxes in publicly accessible locations to facilitate providing services to consumers. The boxes contain a plurality of small form-factor pluggable (SFP) transceiver modules to increase the performance capabilities of the box.

The transceiver module is a compact, hot-pluggable transceiver used for both telecommunication and data communications applications. The SFP transceiver module interfaces a network device mother board (e.g., a switch, router, media converter or similar device) to a fiber optic or copper networking cable. SFP transceiver modules are designed to support SONET, Gigabit Ethernet, Fibre Channel, and other communications standards. The SFP module was designed after the GBIC (gigabit interface converter) interface, and allows greater port density (e.g., a greater number of transceivers per cm along the edge of a mother board) than the GBIC, which is why a SFP is also known as a mini-GBIC.

The SFP transceiver modules are typically inserted into a metal cage that is mounted on a printed circuit board (PCB). An exposed board edge near a first end of the SFP inserts into a mating connector attached to the PCB. A latch on the SFP locks into an opening in the metal cage to hold the assembly together. A data cable can then be connected to a second end of the SFP.

A problem associated with the publicly mounted telecommunication distribution boxes is the removal or theft of the SFP transceiver modules, which are expensive. Additionally, the removal of the SFP transceiver modules can result in the interruption of service to consumers. Accordingly, a need exists for a security mechanism to prevent the theft or removal of SFP transceiver modules by unauthorized persons.

SUMMARY OF THE INVENTION

An object of the present invention is to provide an improved telecommunication distribution box that prevents the theft or removal of electrical components by unauthorized persons.

Another object of the present invention is to provide a cover plate that substantially covers electrical components such that the electrical components are not readily visible.

Still another objective of the present invention is to provide a cover plate to substantially prevent access to a latch release lever of SFP transceiver modules.

Still another objective of the present invention is to provide a lockable cover plate that is movable between a first position allowing access to SFP transceiver modules and a second position substantially preventing access to the SFP transceiver modules.

In accordance with an aspect of the present invention, a telecommunications distribution box includes a housing and an electrical component mounted in the housing. A cover plate is movably connected to the housing and is movable between open and closed positions. A lip extends outwardly from the cover plate. The lip covers the electrical component when the cover plate is in the closed position to prevent accessing and removing the electrical component.

In accordance with another aspect of the present invention, a telecommunications distribution box includes a housing and a mounting panel disposed in the housing. A small form-factor pluggable (SFP) transceiver module is removably connected to the mounting panel. A cover plate is movably connected to the mounting panel and movable between open and closed positions. A lip extends outwardly from the cover plate and covers the SFP transceiver module electrical component when the cover plate is in the closed position to prevent accessing and removing the SFP transceiver module. A plurality of DS1 and/or DS3 ports are connected to the mounting panel and are accessible when the cover plate is in the open and closed positions. A plurality of Ethernet ports are connected to the mounting panel and are accessible when the cover plate is in the open and closed positions.

In accordance with another aspect of the present invention, a method of preventing access to a small form-factor pluggable (SFP) transceiver module installed in a telecommunications distribution box includes installing the SFP transceiver module with a cover plate in an open position. The cover plate is moved to a closed position such that a lip covers the SFP transceiver module to prevent accessing a release latch thereof.

Other objects, advantages and salient features of the invention will become apparent from the following detailed description, which, taken in conjunction with the annexed drawings, discloses a preferred embodiment of the present invention.

As used in this application, the terms "front," "rear," "upper," "lower," "upwardly," "downwardly," and other orientational descriptors are intended to facilitate the description of the exemplary embodiment of the present invention, and are not intended to limit the structure of the exemplary embodiment of the present invention to any particular position or orientation.

BRIEF DESCRIPTION OF THE DRAWINGS

The above aspects and features of the present invention will be more apparent from the description for an exemplary embodiment of the present invention taken with reference to the accompanying drawings, in which:

FIG. 1A is a perspective view of a customer box in accordance with an exemplary embodiment of the present invention;

FIG. 2 is a perspective view of an open customer box with a cover plate in an open position;

FIG. 3 is a partial enlarged perspective view of inserted SFP transceiver modules;

FIG. 6 is another perspective view of the mounting panel and cover plate of FIG. 4;

FIG. 7 is a perspective view of the mounting panel and cover plate of FIG. 2 in a closed position;

FIG. 8 is a perspective view of the mounting panel and cover plate of FIG. 7 with a fastener threadably locking the cover plate to the mounting panel;

FIG. 9 is a front elevational view of the mounting panel and cover plate of FIG. 2 with the mounting panel in the closed position;

FIG. 10 is a partial enlarged front elevational view of the lip of the cover plate of FIG. 9;

FIG. 11 is a bottom plan view with a partial cutaway of the housing with the cover plate in the closed position;

FIG. 12 is a front elevational view of the mounting panel and cover plate of FIG. 2 with the cover plate in the closed position;

FIG. 13 is a top plan view of the mounting panel and cover plate of FIG. 12;

FIG. 14 is a right side elevational view of the mounting panel and cover plate of FIG. 12;

FIG. 15 is a bottom plan view of the mounting plate and cover plate of FIG. 12;

FIG. 16 is a left side elevational view of the mounting panel and cover plate of FIG. 12;

FIG. 17 is a perspective view of the cover plate of FIG. 2;

FIG. 18 is a partial enlarged front elevational view of the lip of the cover plate of FIG. 17;

FIG. 19 is a front elevational view of the cover plate of FIG. 17;

FIG. 20 is a partial enlarged front elevational view of the tab of the cover plate of FIG. 19;

Throughout the drawings, like reference numerals will be understood to refer to like parts, components and structures.

DETAILED DESCRIPTION OF EXEMPLARY EMBODIMENT

Figure 1B:
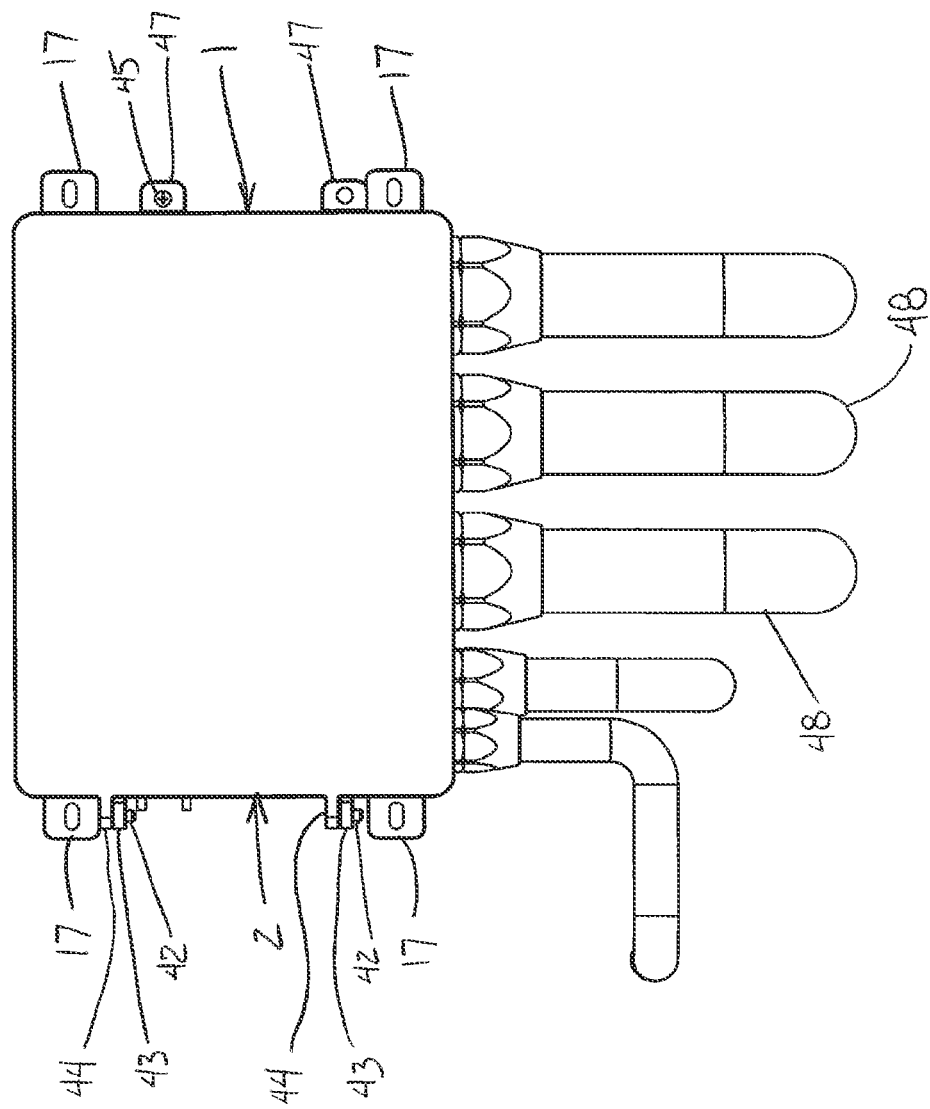
FIG. 1B is a front elevational view of the box of FIG. 1A.

As shown in FIGS. 1A-26, a cover plate for an electrical component substantially prevents access to and visibility of installed electrical components. Although the exemplary embodiment of the present invention is shown and described with regard to preventing unauthorized removal of an SFP transceiver module, the present invention is equally applicable to preventing unauthorized removal of any electrical component.

As shown in FIGS. 1A, 1B, 2, 9 and 11, a telecommunication distribution box 1 includes a housing 2 and a cover 3 pivotally connected thereto. A screw, padlock or any other suitable fastening means can be used to secure the cover 3 to the housing 2 in the closed position. Pins 42 are received between corresponding connection members 43 and 44 of the housing 2 and cover 3, respectively, to allow the cover 3 to move between open and closed positions. Fasteners 45 are received by corresponding locking members 46 and 47 of the housing 2 and cover 3, respectively, to secure the cover 3 to the housing 2. Mounting ears 17 extending outwardly from the housing 2 allow the box 1 to be connected to a suitable support, such as a building wall or an H-frame support.

A plurality of circuit boards 5 and a mounting panel 4 are disposed in the housing 2 to facilitate electrical component installation and connections to provide services. As shown in FIG. 2, a mounting panel 4 is connected proximal a circuit board 5 to facilitate electrically connecting an electrical component to the circuit board 5. A plurality of openings 6 are disposed in a wall 7 of the housing 2 to allow wires (such as fiber optic cable 54 of FIG. 24) of installed electrical components to pass through the housing. The wires can be disposed in conduits 48 for protection, as shown in FIGS. 1A and 1B.

As shown in FIG. 2, a plurality of electrical connectors are disposed on the circuit board 5. For example, a plurality of customer Ethernet ports 8, a plurality of customer DS1 and/or DS3 ports 9 and a plurality of customer fiber optic ports 10 may be provided, although any suitable configuration and connectors can be used. The four Ethernet ports 8 and the twelve DS1 and/or DS3 ports 9 are preferably RJ-45 jacks, as shown in FIG. 2. The fiber optic ports 10 are preferably SFP transceiver modules 11.

Figure 4:
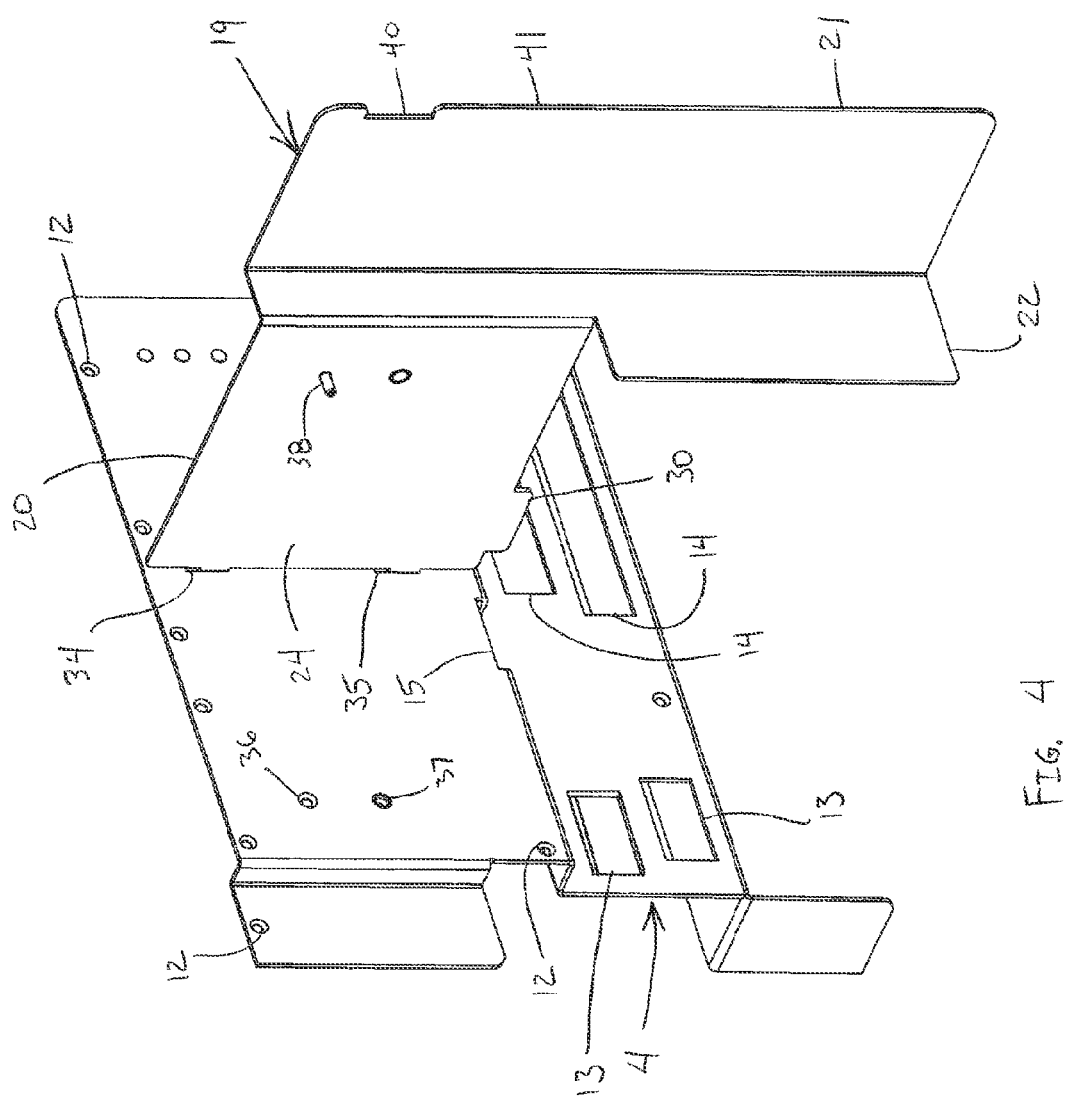
FIG. 4 is a perspective view of the mounting panel and cover plate of FIG. 2 in an open position without SFP transceiver modules installed and with the housing and cover of the box removed for clarity.

As shown in FIG. 4, a plurality of fastener openings 12 in the mounting panel 4 secures the mounting panel to the housing 2. First port openings 13 in the mounting panel 4 receive the Ethernet ports 8. Preferably, there are two rows of the first port openings 13 such that each row receives two Ethernet ports 8, as shown in FIG. 2. Second port openings 14 receive the DS1 and/or DS3 ports 9. Preferably, there are two rows of the second port openings 14 such that each row receives six DS1 and/or DS3 ports 9.

Figure 23:
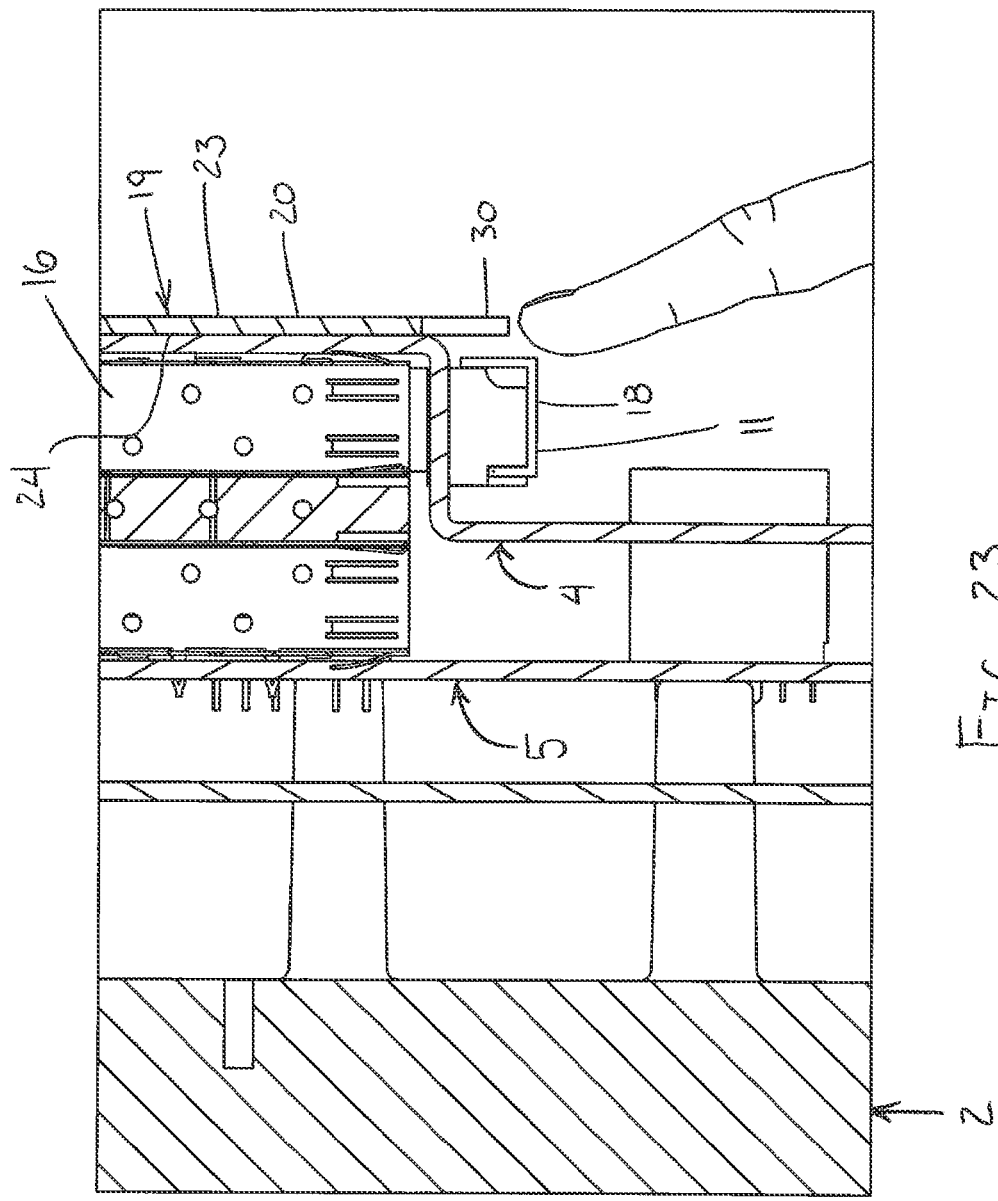
FIG. 23 is a side elevational view in cross section of the cover plate lip preventing access to the latch release lever of an inserted SFP transceiver module.

A mounting cage 16 connected to the circuit board 5 is aligned with a fiber optic port opening 15 in the mounting panel 4, as shown in FIGS. 2, 11 and 23. The mounting cage 16 receives one SFP transceiver module 11, as shown in FIG. 11. Any suitable mounting cage 16 can be used, such as a mounting cage that receives two, four or any suitable number of SFP transceiver modules 11. The SFP transceiver modules 11 are preferably disposed in a single row, as shown in FIG. 11. Each SFP transceiver module 11 preferably can receive two fiber optic cables.

The SFP transceiver modules 11 are conventional and shown connected to the conventional mounting cage 16 in FIGS. 2, 3, 5, 6, 9, 11, 23 and 24. Each SFP transceiver module 11 has a latch release lever or bail 18, as shown in FIGS. 3 and 23-26, to facilitate removing the installed SFP transceiver module 11 from the mounting cage 16. A spring-loaded latching ramp 61 on the SFP transceiver module 11 is pushed inwardly into a body 69 of the module 11 as the latching ramp 61 engages a cage ramp 63 of the mounting cage 16. The inward movement of the latching ramp 61 allows the module 11 to be inserted in the mounting cage 16.

Figure 26:
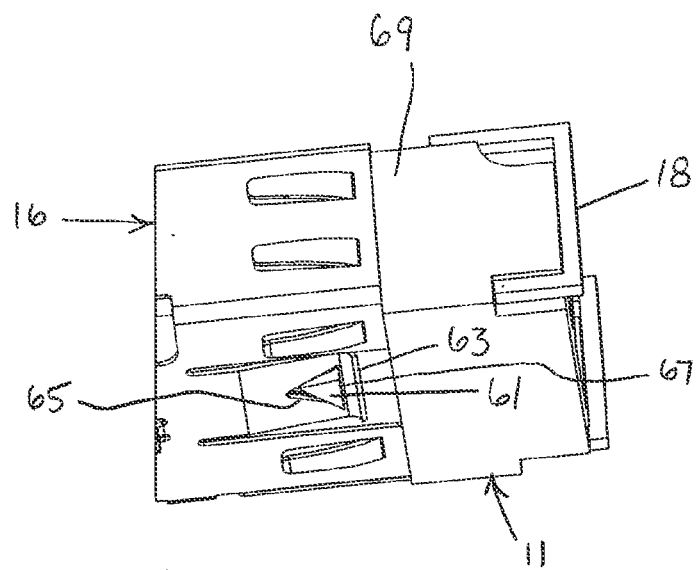
FIG. 26 is a perspective view of the SFP transceiver connected to the mounting cage.

When the latching ramp 61 passes the cage ramp 63, the spring-loaded latching ramp 61 moves back to its initial position and engages a cage latch opening 65, as shown in FIG. 26. A front surface 67 of the latching ramp 61 engages the cage ramp 63, thereby preventing accidental removal of the module 11 from the mounting cage 16.

Moving the latch release lever 18 downwardly unlocks the SFP transceiver module 11 from the mounting cage 16 such that the SFP transceiver module 11 can be removed from the mounting cage. The latch release lever 18 is pivotally connected to the module 11 to allow pivoting movement of the lever 18. The latch release lever 18 is connected to the latching ramp 61, such that pivotal movement of the lever 18 causes the latching ramp 61 to be retracted into the body 69 of the module 11. When the latch release lever 18 is in the position shown in FIGS. 3 and 26, the SFP transceiver module 11 is secured to the mounting cage 16 such that the SFP transceiver module cannot be removed from the mounting cage. The lever 18 is in a position that the latching ramp 61 engages the cage ramp 63 to prevent removal of the module 11. Rotating the lever 18 (in a clockwise direction with regard to FIGS. 25 and 26) causes the latching ramp 61 to move into the module body 69 such that the latching ramp 61 no longer engages the cage ramp 63 and the SFP transceiver module 11 can be removed from the mounting cage 16.

A cover plate 19 is pivotally connected to the mounting panel 4, as shown in FIG. 2. The cover plate 19 is movable between a first or open position shown in FIGS. 2, 5 and 6 and a second or closed position shown in FIGS. 7 and 8.

The cover plate 19, as shown in FIGS. 17-23, includes a first plate member 20, a second plate member 21 and a connecting member 22 connecting the first and second plate members. The first and second plate members 20 and 21 are preferably substantially parallel to each other, and the connecting member 22 is preferably substantially perpendicular to the first and second plate members 20 and 21.

Figure 21:
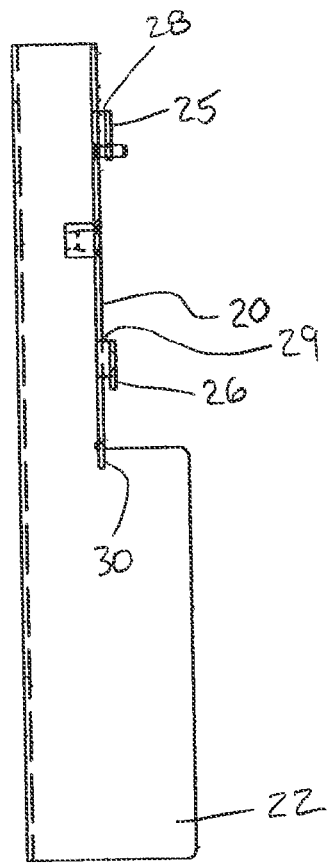
FIG. 21 is a right side elevational view of the cover plate of FIG. 17.
Figure 22:
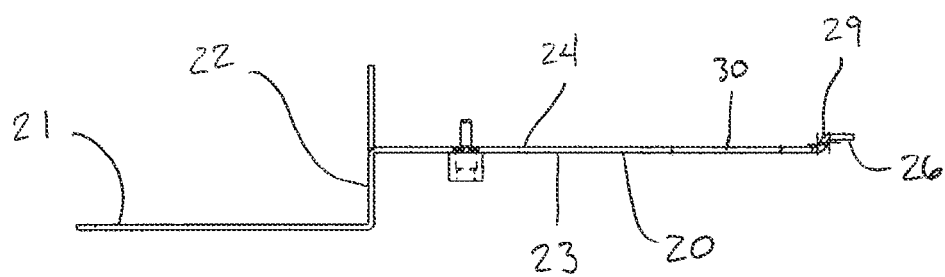
FIG. 22 is a top plan view of the cover plate of FIG. 17.

The first plate member 20 has an upper surface 23 and a lower surface 24, as shown in FIGS. 17, 19 and 22. First and second tabs 25 and 26 extend outwardly from a first edge 27 of the first plate member 20. As shown in FIGS. 17, 21 and 22. the first and second tabs 25 and 26 are connected to the first plate member 20 by connecting members 28 and 29, which extend downwardly from the first edge 27 of the first plate member 19. The first and second tabs 25 and 26 are disposed in a second plane substantially parallel to the plane of the first plate member 20, as shown in FIG. 21. Preferably, as shown in FIGS. 17 and 20, the tabs 25 are longer than the connecting members 28.

A recess 40 in an edge 41 of the second plate member 21, as shown in FIGS. 7 and 8, allows a flat, braided metal strap (not shown) to extend out of the box 1 when the cover plate 19 is in the closed position. The strap provides an electrical connection between the housing 2 and the cover 3 to ensure that the cover is electrically grounded when the box 1 is properly connected to earth ground.

A lip 30 extends outwardly from a second edge 31 of the first plate member 20, as shown in FIGS. 17 and 19. Preferably, the second edge 31 is substantially perpendicular to the first edge 27. As shown in FIG. 18, labeling 32 can be disposed on the upper surface 23 of the first plate member 20 and the lip 30 to identify the type of connection covered by the lip 30.

A third edge 33 of the first plate member 20 is connected to the connecting member 22, as shown in FIGS. 17 and 19. Preferably, the first and third edges 27 and 33 are substantially parallel and the second edge 31 is substantially perpendicular to the first and third edges 27 and 33.

Figure 5:
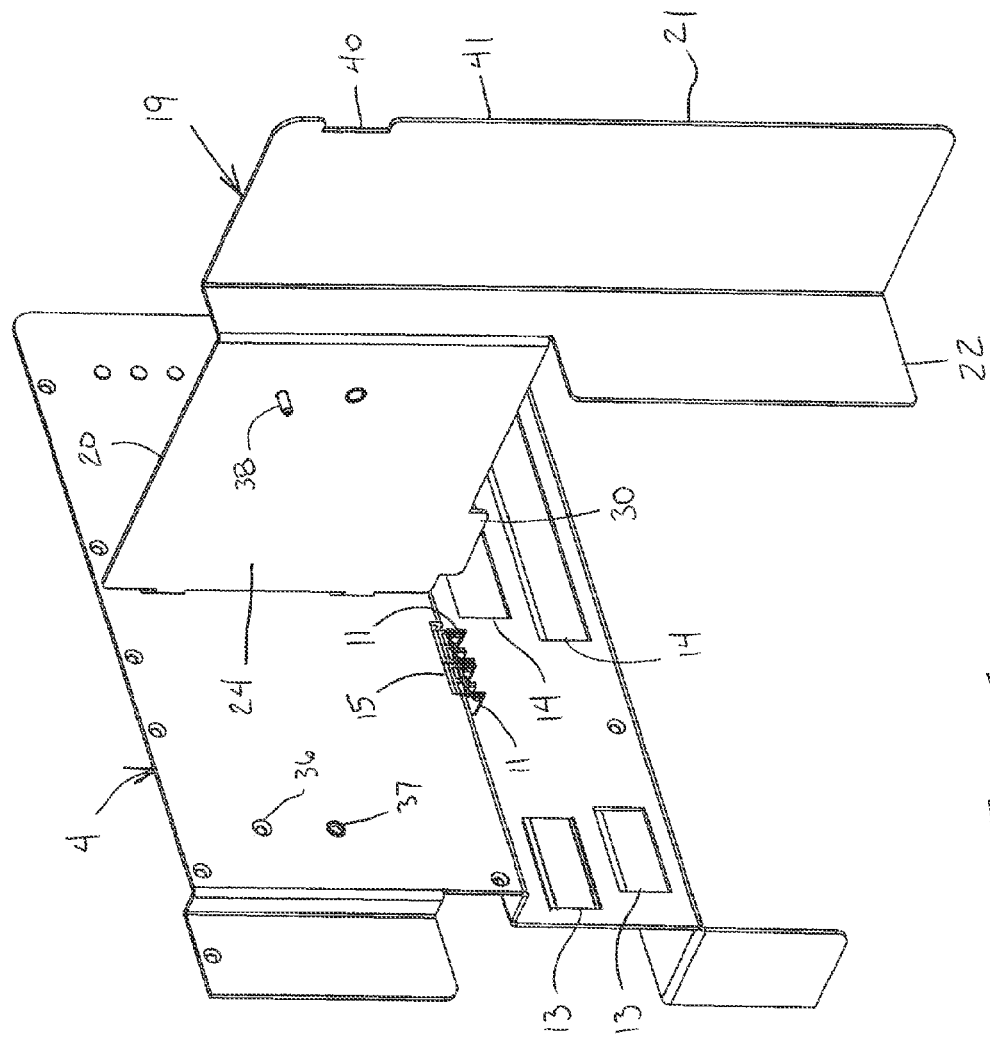
FIG. 5 is a perspective view of the mounting panel and cover plate of FIG. 4 with SFP transceiver modules installed.

First and second elongated slots 34 and 35 in the mounting panel 4 receive the first and second tabs 25 and 26, as shown in FIGS. 4-6. The cover plate 19 is movable between a first position shown in FIGS. 4-6 and a second position shown in FIGS. 7-9. The tabs 25 and 26 being longer than the connecting members 28 and 29 allow the tabs 25 and 26 to be inserted in the slots 34 and 35 such that a bottom edge of the connecting members 28 and 29 abuts a bottom edge of the slots to prevent the tabs 25 and 26 from falling out of the slots when the cover plate 19 is disposed vertically, as shown in FIG. 4. Alternatively, any suitable hinge member can be used between the cover plate 19 and the mounting panel 4 to facilitate moving the cover plate 19 between open and closed positions.

In the first position, as shown in FIGS. 2, 3, 5 and 6, the cover plate 19 is in the open position such that the inserted SFP transceiver modules 11 are easily accessible. Thus, the latch release levers 18 of the SFP transceiver modules 11 can be grasped and manipulated to remove the SFP transceiver modules 11 as necessary.

Figure 24:
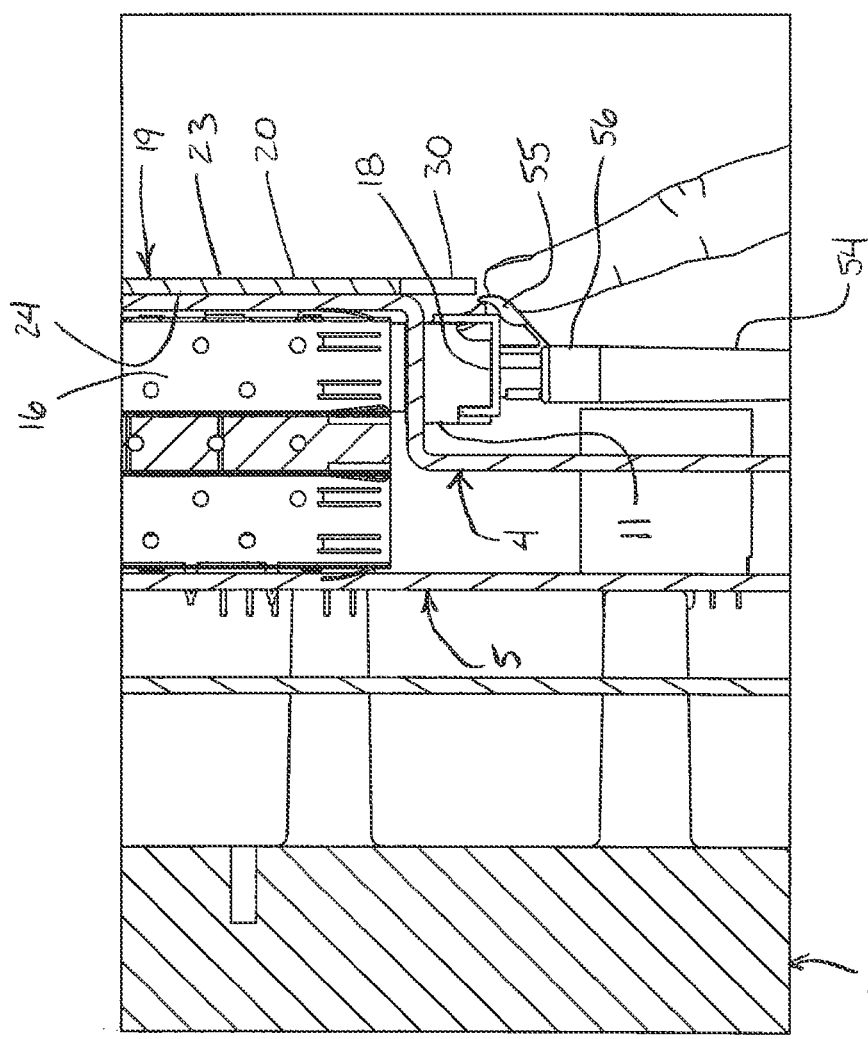
FIG. 24 is a side elevational view in cross section of the SFP transceiver module of FIG. 23 with a cable connected thereto.
Figure 25:
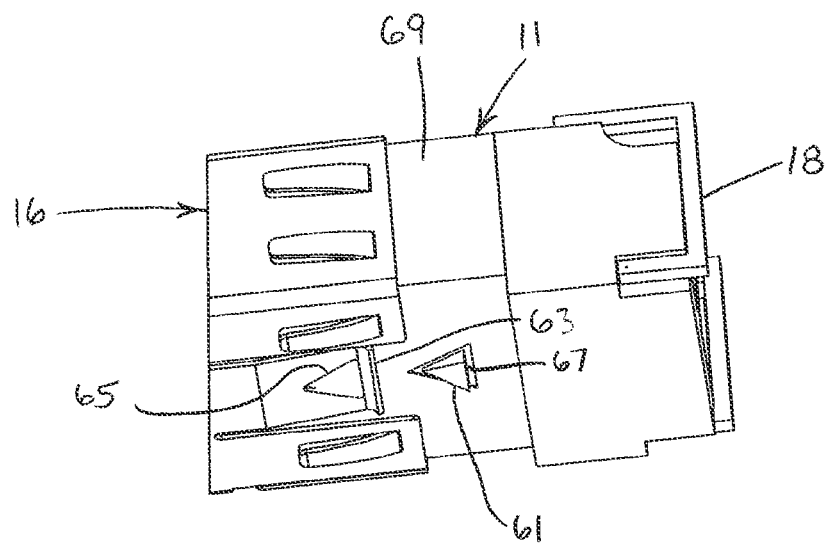
FIG. 25 is a perspective view of the SFP transceiver prior to being connected to a mounting cage.

In the second position, as shown in FIGS. 7-16 and 23, the cover plate 19 is in the closed position such that accessing and viewing the inserted SFP transceiver modules 11 is substantially prevented. The lip 30 of the cover plate hangs over the exposed ends of the SFP transceiver modules 11 such that the latch release levers 18 are not accessible and cannot be seen, thereby discouraging theft and removal by unauthorized persons. As shown in FIG. 23, the lip 30 substantially prevents access to the latch release lever 18 such that the latch release lever 18 cannot be operated to unlock the SFP transceiver module 11 from the mounting cage 16. The lip 30 of the cover plate 19 is preferably at least wide enough to cover the inserted SFP transceiver modules 11, as shown in FIG. 10. Accordingly, the lip 30 of the cover plate 19 is wide enough to cover all the inserted SFP transceiver modules 11, such that a wider lip 30 is used when a larger number of SFP transceiver modules are received. The fiber optic cable 54 connected to the SFP transceiver module 1 is accessible when the cover plate 19 is in the closed position and the lip 30 covers the SFP transceiver module 11, as shown in FIG. 24. A release arm 55 of a fiber optic plug 56 is accessible with the cover plate 19 in the closed position such that the release arm 55 can be operated to remove the plug 56 and cable 54 from the SFP transceiver module 11, while the lip 30 prevents accessing and removing the SFP transceiver module.

The second plate member 21 covers other electrical components disposed in the housing 2, as shown in FIGS. 2 and 9. The second plate member 21 extends between opposite first and second walls 51 and 52 of the housing 2 and to a third wall 53 extending between the first and second walls. Accordingly, the second plate member 21 allows a second portion of the housing 2 to be covered in addition to a first portion covered by the first plate member 20, as shown in FIG. 9.

First and second openings 36 and 37 are disposed in the mounting panel 4, as shown in FIGS. 2 and 4-6. Preferably, the second opening 37 is threaded. A guide post 38 is connected to the lower surface 24 of the first plate member 20. When the cover plate 19 is moved to the second position, the guide post 38 is received by the first opening 36 in the mounting panel 34 to facilitate aligning the cover plate 19 with the mounting panel 4. A captive fastener 39, or any other suitable fastener member, is connected to the first plate member 20 of the cover plate 19, as shown in FIGS. 7 and 8. The fastener 39 is threaded into the second opening 37 in the mounting panel to lock the cover plate 19 to the mounting panel 4. A tool can be inserted in the recess 40 in the second plate member 21 to facilitate moving the cover plate 19 to the first position after the fastener 39 is unthreaded from the second opening 37. The SFP transceiver module 11 can now be easily accessed.

The foregoing embodiment and advantages are merely exemplary and are not to be construed as limiting the scope of the present invention. The description of an exemplary embodiment of the present invention is intended to be illustrative, and not to limit the scope of the present invention. Various modifications, alternatives and variations will be apparent to those of ordinary skill in the art, and are intended to fall within the scope of the invention as defined in the appended claims and their equivalents.

What is claimed is:

1. A telecommunications distribution box, comprising:
a housing;
an electrical component removably mounted in said housing;
a cover plate moveably connected to a mounting panel disposed in said housing and movable between open and closed positions; and
a lip extending outwardly from said cover plate, said lip covering at least a portion of said electrical component when said cover plate is in said closed position to prevent accessing and removing said electrical component.

2. The telecommunications distribution box according to claim 1, wherein said electrical component is a small form-factor pluggable (SFP) transceiver module.

3. The telecommunications distribution box according to claim 2,
wherein
said lip covers a release latch of said SFP transceiver module to prevent accessing and removing said SFP transceiver module.

4. The telecommunications distribution box according to claim 1, wherein
tabs extending outwardly from said cover plate are received by slots in said housing to allow said cover plate to pivot between said open and closed positions.

5. The telecommunications distribution box according to claim 1, wherein
a fastener secures said cover plate to said housing when said cover plate is in said closed position.

6. The telecommunications distribution box according to claim 5, wherein
said fastener is a captive fastener.

7. The telecommunications distribution box according to claim 1, wherein
a recess in said cover plate allows access for a tool to facilitate pivoting said cover plate from said closed to said open position.

8. The telecommunications distribution box according to claim 1, wherein
a plurality of DS1 and/or DS3 ports are mounted in said housing and are accessible when said cover plate is in said open and closed positions.

9. The telecommunications distribution box according to claim 1, wherein
a plurality of Ethernet ports are mounted in said housing and are accessible when said cover plate is in said open and closed positions.

10. A telecommunications distribution box, comprising:
a housing;
a mounting panel disposed in said housing;
an electrical component removably connected to said mounting panel;
a cover plate movably connected to said mounting panel and movable between open and closed positions;
a lip extending outwardly from said cover plate, said lip covering said electrical component when said cover plate is in said closed position to prevent accessing and removing said electrical component; and
a plurality of ports connected to said mounting panel and being accessible when said cover plate is in said open and closed positions.

11. The telecommunications distribution box according to claim 10, wherein said lip covers a release latch of said electrical component.

12. The telecommunications distribution box according to claim 10, wherein tabs extending outwardly from said cover plate are received by slots in said mounting panel to allow said cover plate to pivot between said open and closed positions.

13. The telecommunications distribution box according to claim 10, wherein
a fastener secures said cover plate to said mounting panel when said cover plate is in said closed position.

14. The telecommunications distribution box according to claim 10, wherein a recess in said cover plate allows access for a tool to facilitate pivoting said cover plate from said closed to said open position.

15. A telecommunications distribution box, comprising:
a housing;
a port positioned in said housing;
an electrical component removably mounted in said housing; and
a cover plate moveably connected to a mounting panel disposed in said housing and having a lip extending outwardly from said cover plate to cover said electrical component when said cover plate is in a closed position to prevent accessing and removing said electrical component.

16. The telecommunications distribution box of claim 15, wherein
said cover plate includes a first plate member and a second plate member.

17. The telecommunications distribution box of claim 16, wherein
said lip extends from said first plate member.

18. The telecommunications distribution box of claim 15, wherein
said cover plate is connected to a mounting panel.

19. The telecommunications distribution box of claim 15, wherein a cover is connected to the housing.

* * * * *